United States Patent [19]

Regler et al.

[11] 4,246,003
[45] Jan. 20, 1981

[54] LAP CUTTING ABRASIVE

[75] Inventors: Dieter Regler; Alfred Moritz, both of Burghausen, Fed. Rep. of Germany

[73] Assignee: Wacker Chemitronic Gesellschaft Für Elektronik-Grundsoffe MBH, Burghausen, Fed. Rep. of Germany

[21] Appl. No.: 63,653

[22] Filed: Aug. 3, 1979

Related U.S. Application Data

[63] Continuation-in-part of Ser. No. 903,643, May 1, 1978, abandoned.

[30] Foreign Application Priority Data

May 20, 1977 [DE] Fed. Rep. of Germany ....... 2722780

[51] Int. Cl.$^3$ .............................................. B24D 17/00
[52] U.S. Cl. ........................................ 51/293; 51/295; 51/305
[58] Field of Search ................. 51/304, 302, 303, 305, 51/306, 293, 295

[56] References Cited

U.S. PATENT DOCUMENTS

| 2,006,162 | 6/1935 | Fuchs | 51/304 |
| 2,270,888 | 1/1942 | Murray et al. | 51/304 |
| 2,944,879 | 7/1960 | Allen et al. | 51/304 |
| 4,038,048 | 7/1977 | Thrower | 51/306 |

OTHER PUBLICATIONS

Chemie–Lexikon, 1977, p. 3826.

Primary Examiner—Donald J. Arnold
Attorney, Agent, or Firm—Allison C. Collard; Thomas M. Galgano

[57] ABSTRACT

A lap cutting abrasive for use with lap cutting blades, comprising one part by weight of a low viscosity carrier liquid, and one to three parts by weight of cutting particles having an average size of from 10 to 50 μm suspended in the carrier liquid. The carrier liquid has a viscosity of from 1 to 10 cP, and preferably is aqueous glycerin. The cutting particles preferably have an average particle size of from 15 to 30 μm. In a further embodiment, the average particle size of the cutting particles is matched to the thickness of the lap cutting blade used during sawing. Preferably, the cutting particles have an average particle size corresponding to 0.15 to 0.1 times the thickness of the lap cutting blade used during sawing.

6 Claims, No Drawings

LAP CUTTING ABRASIVE

This is a continuation-in-part application of application Ser. No. 903,643, filed May 1, 1978 and now abandoned.

The present invention relates to a lap cutting abrasive consisting of cutting particles having an average particle size of from 10 to 50 $\mu$m suspended in a carrier liquid. It is well known to saw oxidic substances, such as sapphire or ruby, and semiconductor materials, such as silicon or germanium, for example, with band saws having a straight saw blade and free cutting particles. To achieve a satisfactory yield of sawn discs, several saw blades combined in a frame are normally used. The smooth steel cutting edges acting as saw blades carry with them, as they move over the solid material to be cut, a lap cutting abrasive, such as, for example, diamond powder, suspended in a carrier liquid. A relatively high-viscosity mineral oil is normally used as the carrier liquid in a proportion of approximately two to four times the amount by weight, calculated on the weight of the cutting particles suspended therein. The advantage of this sawing process with respect to other types of saws having bonded cutting particles, for example saws having an inner hole, lies in the uniform damage to the surface of the cutting face which can be easily eliminated by etching a thin surface layer, and in the fact that almost all discs are "bowfree", that is to say, uniformly flat and with no bowing. The disadvantage of this sawing process compared with sawing processes using bonded cutting particles, for example, processes employing saws having inner holes, lies in the long sawing times. Even with 240 blades in the frame, the sawing time per disc in still approximately twice as great as the time taken with the conventional, innerhole saws. Only as a result of the development of a new gang sawing or lap cutting process, operating with shorter blades, higher pressure and increased lateral speed of the blades passing through the solid material to be cut, was it possible to achieve sawing times per disc that distinctly surpass the times obtained with inner-hole saws. However, in order to make it possible to manufacture silicon solar cells for industrial use, the individual processing steps must be further optimized. The aim of the present invention is therefore to further reduce the sawing time per disc when gang sawing or when multiple lap cutting.

This aim in achieved by using a lap cutting abrasive which has not only one part by weight of a low-viscosity carrier liquid, but contains from one to three parts by weight of cutting particles.

The customary agents, such as corundum powder, silicon carbide, boron carbide, cubic boron nitride or diamond powder are used as the solid constituent of this lap cutting abrasive, the hardness and thus the service life increasing in the sequence given. These substances are used with an averge particle size of from 10 to 50 $\mu$m, preferably from 15 to 30 $\mu$m, corresponding to the current industrial standard (FEPA, ASTM). Advantageously, the average particle size of the cutting particles is matched to the thickness of the lap cutting blade used during the sawing, this thickness normally being approximately 100 to 300 $\mu$m. The average particle size is conveniently selected within the given range so that it corresponds approximately to 0.25 to 0.07 times, preferably from 0.15 to 0.1 times, the thickness of the lap cutting blade used during sawing. Generally, liquids having a viscosity of approximately 1 to 10 cP, preferably from 1 to 5 cP, may be considered as carrier liquid; they are substantially inert towards the cutting blade and also towards the solid material to be cut, that is to say, they neither corrode them nor permanently contaminate them. Such liquids are, for example, different mineral oils, synthetic oils, glycerin/water mixtures, aqueous methyl cellulose solutions or, for example, polyvinyl alcohol/water mixtures.

In each case, the cutting particles selected depend on the type of solid material to be cut. Thus, sapphire or spinel, for example, can be cut economically only when using diamond or cubic boron nitride. The lap cutting abrasive is advantageously maintained constantly in motion in the saw, by pumping or stirring, to aviod settling of the cutting particles or coagulation or compacting of the lap cutting abrasive.

When the lap cutting abrasive is used according to the invention, it is additionally advisable to use blades that are provided with recesses at the cutting edge and thus provide for an optimal uptake of the lap cutting abrasive into the cutting groove.

The lap cutting abrasive according to the invention is advantageously used for gang sawing or multiple lap cutting of semiconductor materials, such as silicon, germanium, III-V-compounds, such as gallium arsenide or gallium phosphide, for example, oxidic substances, such as sapphire, spinel or ruby, for example, or alternatively, for soft substances, such as hexagonal boron nitride, for example.

The use of this new lap cutting abrasive enables cutting efficiencies to be obtained that are considerably higher than those achieved using known lap cutting abrasives.

COMPARATIVE EXAMPLE

A monocrystalline silicon rod having the dimensions 50×50×220 mm, was sawn into discs transversely to the longitudinal axis using a lap cutting machine. The saw used was a lap cutting machine corresponding substantially to a gang saw manufactured by the firm of Meyer & Burger AG, Steffisburg, Switzerland, type GS1, but which had been modified so that shorter blades could be moved at a higher speed and with a higher pressure.

The set of blades consisted of 240 blades having a thickness of 200 $\mu$m, a depth of 6 mm and a free working length of 200 mm. The cutting edge of these blades had arched recesses 6 mm in length (measured along the cutting edge) and a depth of 1 mm at the vertex. 20 such recesses at an equal distance apart were formed along the total length of each blade. After placing the blades on the silicon rod, the blades were passed over the crystal in the normal manner at a low initial lateral speed of a few meters per minute, almost without pressure. Only after all blades had started t ) bite into the silicon rod was the lateral speed with which the set of blades was moved through the silicon rod to be cut increased to 45 m/minute. A pressure of 180 gf per blade was exerted on the set of blades during sawing. Silicon carbide having a particle size distribution of from 27 to 30 $\mu$m, suspended in a mineral oil fraction having a viscosity of 45 cP, was used as the lap cutting abrasive, wherein one part of weight of silicon carbide was added for three parts by weight of mineral oil.

After a total sawing time of 2.08 hours, 239 discs having a thickness of 480 $\mu$m were obtained. This corresponds to a cutting efficiency of 0.2 cm² per minute per blade.

EXAMPLE

A silicon rod having the same dimensions as described in the previous example was sawn, with the exception that silicon carbide having an average particle size of from 27 to 30 μm, suspended in a mixture of nine parts by weight of water and one part by weight of glycerin having a viscosity of approximately 1.01 cP was used as the lap cutting abrasive, wherein for one part by weight of carrier liquid 2.5 parts by weight of silicon carbide powder were calculated. By means of a stirrer driven by an electric motor, the lap cutting abrasive was additionally kept constantly in motion.

After a total sawing time of 1.75 hours, 239 discs having a thickness of 500 μm, were obtained. This corresponded to a cutting efficiency of 0.24 cm² per minute per blade.

While several embodiments of the present invention have been shown and described, it will be obvious to those persons of ordinary skill in the art, that many changes and modifications may be made thereunto, without departing from the spirit and scope of the invention.

What is claimed is:

1. A lap cutting abrasive for use with lap cutting blades to saw semiconductor workpieces, consisting essentially of;
   one part by weight of a low viscosity carrier liquid having a viscosity of approximately 1 to 10 cP; and
   one to three parts by weight of cutting particles having an average size of from 10 to 50 μm suspended in said carrier liquid.

2. The lap cutting abrasive according to claim 1, wherein said carrier liquid has a viscosity of from 1 to 5 cP.

3. The lap cutting abrasive according to claim 2, wherein said carrier liquid comprises aqueous glycerin.

4. The lap cutting abrasive according to claim 1, wherein said cutting particles have an average particle size of from 15 to 30 μm.

5. The lap cutting abrasive according to claim 1, wherein the average particle size of the cutting particles correspond to the thickness of the lap cutting blade used during sawing.

6. The lap cutting abrasive according to claim 5, wherein the cutting particles have an average particle size corresponding to 0.15 to 0.1 times the thickness of the lap cutting blade used during sawing.

* * * * *